(12) United States Patent
Sele et al.

(10) Patent No.: US 8,536,579 B2
(45) Date of Patent: Sep. 17, 2013

(54) ELECTRONIC DEVICE HAVING SPATIALLY INVERTED THIN FILM TRANSISTORS

(75) Inventors: Christoph Wilhelm Sele, London (GB); Monica Johanna Beenhakkers, Helmond (NL); Gerwin Hermanus Gelinck, Valkenswaard (NL); Nicolaas Aldegonda Jan Maria Van Aerle, Eindhoven (NL); Hjalmar Edzer Ayco Huitema, Veldhoven (NL)

(73) Assignee: Creator Technology B.V., Breda (NL)

( * ) Notice: Subject to any disclaimer, the term of this patent is extended or adjusted under 35 U.S.C. 154(b) by 492 days.

(21) Appl. No.: 12/669,704

(22) PCT Filed: Jul. 16, 2008

(86) PCT No.: PCT/NL2008/050482
§ 371 (c)(1),
(2), (4) Date: Jun. 7, 2010

(87) PCT Pub. No.: WO2009/011581
PCT Pub. Date: Jan. 22, 2009

(65) Prior Publication Data
US 2010/0237352 A1    Sep. 23, 2010

Related U.S. Application Data

(60) Provisional application No. 60/950,276, filed on Jul. 17, 2007.

(51) Int. Cl.
| | |
|---|---|
| H01L 29/10 | (2006.01) |
| H01L 29/76 | (2006.01) |
| H01L 31/036 | (2006.01) |
| H01L 31/112 | (2006.01) |
| H01L 29/04 | (2006.01) |
| H01L 31/0376 | (2006.01) |
| H01L 31/20 | (2006.01) |
| H01L 29/15 | (2006.01) |
| H01L 31/062 | (2012.01) |
| H01L 31/113 | (2006.01) |
| H01L 27/01 | (2006.01) |
| H01L 27/12 | (2006.01) |
| H01L 31/0392 | (2006.01) |

(52) U.S. Cl.
USPC ............ 257/66; 257/57; 257/59; 257/72; 257/291; 257/340; 257/351; 257/E27.027; 257/E29.117; 257/E29.137; 257/E29.151; 257/E29.202; 257/E29.273; 257/E29.275; 257/E29.291; 257/E29.294

(58) Field of Classification Search
USPC ............ 257/57, 59, 66, 72, 291, E29.117, 257/E29.151, E29.202, E29.273, E29.275, 257/350, 351, E27.027, E29.137, E29.291, 257/E29.294
See application file for complete search history.

(56) References Cited

U.S. PATENT DOCUMENTS 4,385,292 A * 5/1983 Nonomura et al. ............ 345/53
5,585,647 A   12/1996 Nakajima et al.
(Continued)

FOREIGN PATENT DOCUMENTS

EP   1950804 A2    7/2008
JP   2003131257 A *   5/2003
(Continued)

OTHER PUBLICATIONS

Bonse M et al.,"Integrated a-Si:H/pentacene Inorganic/Organic Complementary Circuits" Electron Devices Meeting,1998. IEDM '98 Technical Digest., International San Francisco, CA, USA Dec. 6-9, 1998, Piscataway,NJ, USA,IEEE, US, Dec. 6, 1998, pp. 249-252.

(Continued)

Primary Examiner — Ida M Soward

(57) ABSTRACT

The invention relates to an electronic device including a sequence of a first thin film transistor (TFT) and a second TFT, the first TFT including a first set of electrodes separated by a first insulator, the second TFT comprising a second set of electrodes separated by a second insulator, wherein the first set of electrodes and the second set of electrodes are formed from a first shared conductive layer and a second shared conductive layer, the first insulator and the second insulator being formed by a shared dielectric layer. The invention further relates to a method of manufacturing an electronic device.

14 Claims, 2 Drawing Sheets

(56) References Cited

U.S. PATENT DOCUMENTS

| | | | |
|---|---|---|---|
| 5,612,228 | A | 3/1997 | Shieh et al. |
| 5,684,320 | A * | 11/1997 | Kawashima ................... 257/351 |
| 6,150,708 | A * | 11/2000 | Gardner et al. ................ 257/618 |
| 6,440,877 | B1 * | 8/2002 | Yamazaki et al. ............. 438/780 |
| 6,569,707 | B2 * | 5/2003 | Dimitrakopoulos et al. ... 438/99 |
| 6,649,935 | B2 * | 11/2003 | Hsu et al. ......................... 257/67 |
| 6,649,980 | B2 * | 11/2003 | Noguchi ........................ 257/351 |
| 6,847,422 | B2 * | 1/2005 | Zhang et al. ................... 349/106 |
| 6,974,971 | B2 * | 12/2005 | Young ............................. 257/72 |
| 7,285,798 | B2 * | 10/2007 | Bhattacharyya ................ 257/67 |
| 7,439,096 | B2 * | 10/2008 | Baldwin et al. ................. 438/99 |
| 7,485,508 | B2 * | 2/2009 | Dyer et al. ..................... 438/154 |
| 7,816,721 | B2 * | 10/2010 | Yamazaki et al. ............. 257/306 |
| 8,064,323 | B2 * | 11/2011 | Ono ................................ 369/126 |
| 8,154,199 | B2 * | 4/2012 | Ozawa et al. .................. 313/506 |
| 8,212,364 | B2 * | 7/2012 | Yamazaki et al. ............. 257/777 |
| 2002/0139981 | A1 | 10/2002 | Young |
| 2003/0008437 | A1 * | 1/2003 | Inoue et al. .................... 438/149 |
| 2005/0242717 | A1 * | 11/2005 | Bae et al. ....................... 313/504 |
| 2005/0247936 | A1 * | 11/2005 | Bae et al. ......................... 257/59 |
| 2005/0275038 | A1 * | 12/2005 | Shih et al. ...................... 257/382 |
| 2006/0043373 | A1 * | 3/2006 | Wu et al. .......................... 257/72 |
| 2006/0220211 | A1 * | 10/2006 | Yamazaki et al. ............. 257/686 |
| 2007/0018161 | A1 | 1/2007 | Song et al. |
| 2007/0040170 | A1 | 2/2007 | Cain et al. |
| 2007/0046846 | A1 | 3/2007 | Ono |
| 2007/0114516 | A1 | 5/2007 | Napierala |
| 2008/0242112 | A1 * | 10/2008 | Wu et al. ........................ 438/781 |
| 2011/0169008 | A1 * | 7/2011 | Kimura ............................ 257/71 |

FOREIGN PATENT DOCUMENTS

| | | |
|---|---|---|
| JP | 2005 150641 A | 6/2005 |
| WO | WO 2005/027216 A | 3/2005 |
| WO | WO 2006/061000 A | 6/2006 |

OTHER PUBLICATIONS

Iechi H et al., "Inverter Circuits Using Pentacene and Zno Transistors" Japanese Journal of Applied Physics, Japan, Society of Applied Physics, Tokyo.; JP, vol. 46, No. 48, Apr. 1, 2007, pp. 2645-2649.

International Search Report dated Sep. 16, 2008, for PCT/NL2008/050482.

* cited by examiner

ELECTRONIC DEVICE HAVING SPATIALLY INVERTED THIN FILM TRANSISTORS

FIELD OF THE INVENTION

The invention relates to an electronic device. More particularly, the invention relates to a method of manufacturing an electronic device comprising multiple layers of materials on a substrate.

BACKGROUND OF THE INVENTION

An embodiment of an electronic device as is set forth in the opening paragraph is known from U.S. Pat. No. 4,679,299. The known electronic device constitutes a self-aligned three-dimensionally integrated circuit having two channel regions responsive to a common gate electrode. The known electronic device operates based on a stacked CMOS field effect transistor device wherein a pair of self-aligned field transistors, utilizing a common gate electrode, exhibit minimum source/drain coupling between suitable stack devices and which provide a relatively planar surface topology.

In the known electronic device, multiple semiconductor layers are deposited for structuring the stack. First, suitably doped regions are formed in a silicon substrate layer forming drain and source electrodes of a first Thin Film Transistor (TFT). After this, a layer of dielectric material is deposited for electrically isolating the source and drain electrodes from a gate electrode, after which a second layer of dielectric material is deposited for isolating the gate electrode from the channel. The first TFT forms a lower component of the known electronic device. When the components of the first TFT are formed, a second TFT sharing the gate electrode with the first TFT is formed on top of the first TFT. The second TFT comprises a suitable plurality of dielectric layers for forming source and drain electrodes of the second TFT.

It is a disadvantage of the known electronic device that a plurality of processing steps is necessary for depositing and patterning different layers of materials, notably different layers of dielectric materials.

SUMMARY OF THE INVENTION

It is an object of the invention to provide an electronic device for use in electronic devices, for example in logic devices, wherein simpler design and patterning is enabled.

To this end the electronic device according to the invention comprises a sequence of a first thin film transistor (TFT) and a second TFT, the first TFT comprising a first set of electrodes separated by a first insulator, the second TFT comprising a second set of electrodes separated by a second insulator, wherein a first part of the first set of electrodes and a first part of the second set of electrodes are formed from a first shared conductive layer, a second part of the first set of electrodes and a second part of the second set of electrodes are formed from a second shared conductive layer, the first insulator and the second insulator being formed by a shared dielectric layer.

In accordance with the invention, suitable semiconductor layers that form part of the TFT are processed on different levels in the device stack, for example below and on top of the dielectric layer, and not on the same side of the dielectric layer. Due to this feature processing steps can be selected or optimized for both TFT's with minimal interference with other components of the device. It is noted that the TFT-based electronic device may comprise complementary metal-oxide-semiconductor (CMOS) circuit, or a p-channel metal-oxide-semiconductor circuit (PMOS), or an n-channel metal-oxide-semiconductor circuit (NMOS). Alternatively or additionally, the TFT-based electronic device may comprise an organic-based stack comprising a conductor (metal or organic), an insulator (organic or inorganic), a second conductor (metal or organic) and a semiconductor (organic or inorganic), where the semiconductor can have n-channel or p-channel or ambipolar behavior for one or both semiconductor layers.

The electronic device according to the invention has an advantage that a suitable double TFT electronic device costs one additional layer and one additional patterning step in comparison to a manufacturing process for a single TFT circuit, which usually consists of 4 layers and 4 patterning steps.

The architecture of the electronic device according to the invention may envisage that the like components of the first TFT are spatially inverted with respect to the like components of the second TFT. Notably, the first TFT may be arranged as a bottom-gate structure, whereas the second TFT may be arranged as a top-gate structure, the first TFT and the second TFT being sequentially arranged and being integrated via the shared electrically conducting layers and the shared dielectric layer. In this way the shared dielectric layer is sandwiched between the semiconductor layer of the first TFT and the semiconductor layer of the second TFT. This feature has an additional advantage in that the dielectric layer may act as a protection layer for the semiconductor layer below, notably the first TFT, from potentially detrimental effects of subsequent processing steps of forming further components of the electronic device, notably those of the second TFT.

Further advantageous embodiments of the electronic device are set forth in the claims (e.g., claims 5-13).

A method according to the invention comprises the steps of:

(i) forming a first electrically conductive layer for forming an electrode of the first TFT and an electrode of the second TFT;

(ii) depositing a first semiconductor layer for forming a semiconductor of the first TFT;

(iii) depositing a dielectric layer;

(iv) forming a second electrically conductive layer for forming a further electrode of the first TFT and a further electrode of the second TFT; and (v) depositing a second semiconductor layer for forming a semiconductor of the second TFT.

It is noted that the step of forming a layer may comprise steps of depositing a layer and forming the deposited layer. Alternatively, the step of forming a layer may comprise a single manufacturing step. It should be understood that the first conductive layer may comprise one or more electrodes of the first TFT and one or more electrodes of the second TFT. The second conductive layer may as well comprise one or more electrodes of the first TFT and one or more electrodes of the second TFT. In particular, steps of the method according to the invention may be carried out in different sequences.

For example, by carrying out steps (i)-(ii)-(iii)-(iv)-(v), or (ii)-(i)-(iii)-(iv)-(v); or (i)-(ii)-(iii) (v)-(iv), or (ii)-(i)-(iii)-(v)-(iv); resulting in various combinations of bottom-contact or top-contact top-gate or bottom-gate TFTs.

These and other advantages of the invention will be discussed in further details with reference to figures.

DETAILED DESCRIPTION

Figure 1:
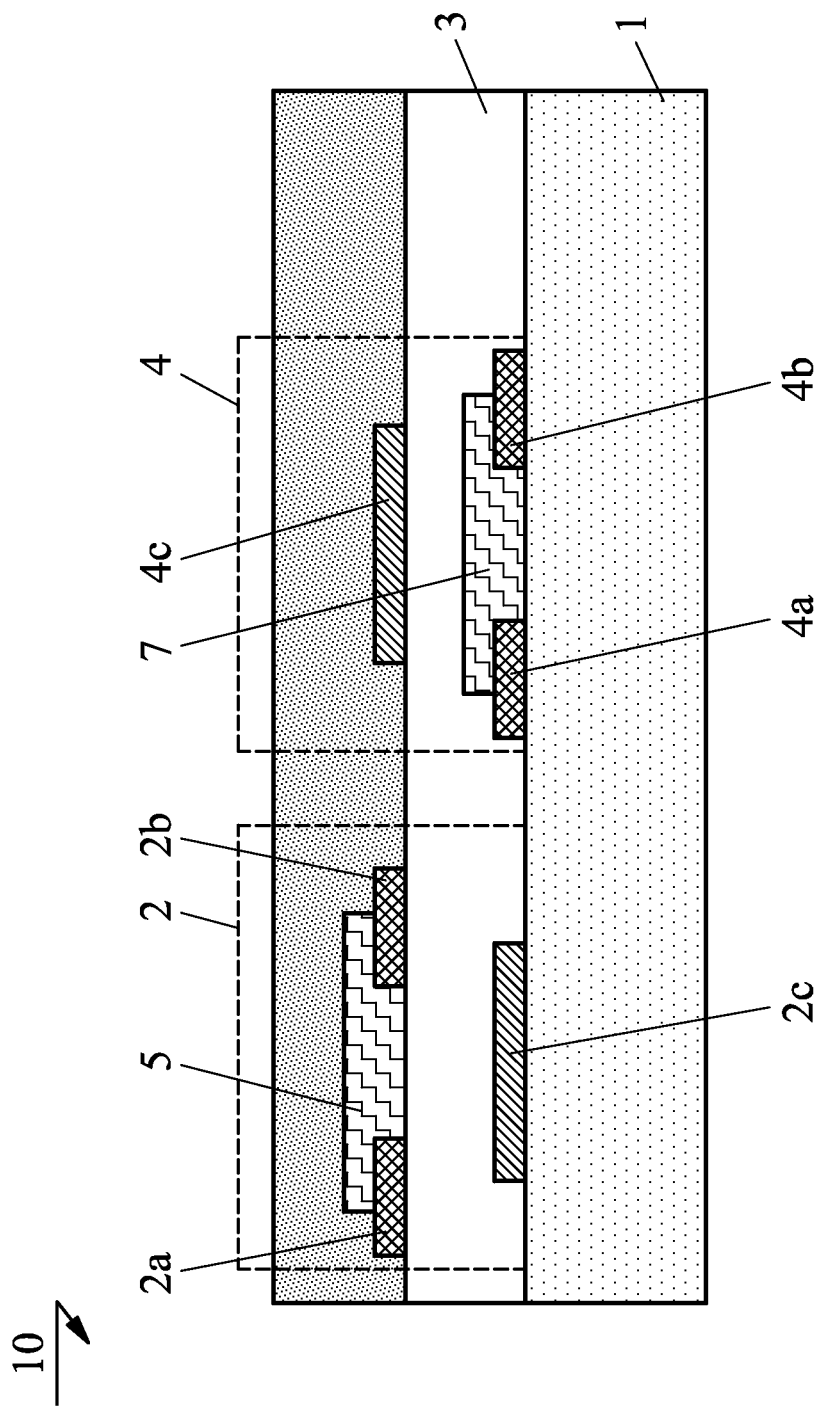
FIG. 1 presents a schematic view of an embodiment of the electronic device according to the invention.

FIG. 1 presents a schematic view of an embodiment of the electronic device according to the invention. The electronic device 10 according to the invention comprises a substrate 1 whereon a first TFT 2 and a second TFT 4 are arranged. It will be understood that any of the TFT's can be implemented as p-type or n-type or ambipolar-type devices, resulting in CMOS, PMOS or NMOS circuits. Additionally or alternatively the TFT-based electronic device may comprise an organic-based stack comprising a conductor (metal or organic), an insulator (organic or inorganic), a second conductor (metal or organic) and a semiconductor (organic or inorganic), where the semiconductor can have n-channel or p-channel or ambipolar behavior for one or both semiconductor layers. The first TFT 2 and the second TFT 4 are arranged at different lateral positions on the substrate 1 thereby forming a suitable sequence. It will be understood that although a sole sequence comprising the first TFT 2 and the second TFT 4 is illustrated, in an actual configuration forming part of a suitable circuitry of an electronic device, a plurality of such sequences can be used. The first TFT is formed as a bottom gate structure, wherein the gate electrode 2c is arranged at the bottom of the electronic device 10. The gate electrode 2c is separated from the source region 2a and the drain region 2b by a suitable layer of a dielectric material 3. The source and drain regions may be formed as a thin film and may be patterned using photolithography or any other patterning method. The source region 2a and the drain region 2b are formed from a suitable semiconductor material 5 by introducing suitably doped region, for example doped contacts for crystalline silicon. Alternatively, the source region 2a and the drain region 2b may be formed from a different, notably conducting material. A suitable example of such embodiment comprises metal contacts arranged on organic semiconductor or inorganic semiconductor. For the semiconductor material 5 either an organic or an inorganic material may be selected. The source and drain layer and the semiconductor layer can also be interchanged regarding layer position without loss of functionality. The second TFT is formed as a top gate structure, wherein the gate electrode 4c is arranged at the top of the electronic device 10. The gate electrode 4c is separated from the source region 4a and the drain region 4b by the same dielectric material 3, which constitutes a common gate dielectric layer for the electronic device 10. The source region 4a and the drain region 4b may be formed as a thin film and may be patterned using photolithography or any other pattering method. The gate region 2c, source region 4a and drain region 4b are patterned in the same process step. The gate region 4c, source region 2a and drain region 2b are patterned in the same process step. For the semiconductor material 7 either an organic or an inorganic material may be selected. For both TFT's 2 and 4 the source and drain layer and the semiconductor layer can be interchanged regarding layer position without loss of functionality. Preferably, for the substrate 1 a flexible carrier is selected, notably a foil. Alternatively, a rigid carrier, for example, glass, ceramics, silicon, steel foil, etc. may also be provided for the substrate 1.

The electronic device 10 according to the invention has several advantages. First, by using shared electrically conducting layers and a common dielectric layer, fewer process steps are needed for manufacturing a circuit comprising two types of TFTs using two different semiconductor layers for operation. This leads to a cost-effective manufacturing process. Secondly, in the embodiment as shown in FIG. 1 the common gate dielectric layer 3 acts as a protective layer for the semiconductor material 7, which otherwise may be damaged during suitable subsequent processing steps. For the common gate dielectric layer the following exemplary materials can be selected: polymer dielectric layers, e.g. polyimide, polymethylmethacrylate, parylene, polynorbonene, epoxy, polyethylene, polystyrene, polyvinylphenol, polyvinylalcohol, or inorganic layers such as $SiN_x$, $SiO_2$, $AlO_x$, $AlN_x$, $HfO_x$, $AlO_xN_x$, $TiO_x$, BZT [Ba(ZrTi)O], BST [Ba(SrTi)O], $TaO_x$ or the like. In combination with suitable semiconductors, these materials show better performance for opposing device structure, like top/bottom gate architecture of components. Due to the combination of the semiconductor and/or dielectric materials optimized for operation for top/bottom gate circuits with the top/bottom design of the circuit, an overall improvement of device characteristics, such as field-effect mobility, on/off ratio, or threshold voltage stability is achieved.

The dielectric layer 3 may comprise a layer of a first material and a layer of a second material, notably wherein one material has a high dielectric constant (e.g. 3.0 to 40) and the other material has a low dielectric constant, e.g. 1.9 to 4.0. The first material may be arranged before or after the second material in the stack. In this way the properties of the dielectric layer, such as dielectric constant and surface polarity, can be optimized with respect to different requirements for the two semiconductors, as well as the electrical properties of the complete stack.

In an alternative embodiment, the first material has a high surface energy (water contact angle smaller than 10°) and the second material may have a low surface energy (water contact angle between 60 and 100°). In this way, the polarity, wetting behavior and adhesion of the dielectric surfaces can be matched to the respective semiconductor layer.

In still yet another alternative embodiment the dielectric layer 3 comprises a mixture or a suitable blend of materials. For example, two polymers, inorganic particles dispersed in a polymer matrix, etc. The blend or mixture components can remain homogeneously distributed, or may undergo phase separation. The latter results in a dielectric with two distinct layers (top and bottom), which may be individually optimized for the first semiconductor material 5 and the second semiconductor material 7.

Generally it will be more practical to pattern the semiconductor layers so that they only remain in the channel regions. However, it is found that leaving the semiconductor on the gate contacts (2c, 4c) has the following advantages: first, the semiconductor can act as additional layer in the dielectric stack, reducing the risk of electrical shorts and, secondly, simplified processing is available, which is advantageous in a mass production. It will be further appreciated that the material of the first semiconductor material 5 may be selected to be the same as the material of the second semiconductor material 7.

The electronic device 10 is manufactured, by way of example, using a following process. First, suitable conducting layer, for example gold layer, is deposited by means of sputtering or evaporation on a suitable substrate. The deposited layer forms a first conductive layer. The first conductive layer is then patterned using, for example, lithography followed by wet or dry etching. The resulting patterned conductive layer may represent respective electrodes (gate) of the first TFT 2 and respective electrodes (source and drain) of the second TFT 4. After the gate electrode 2c and the source and drain electrodes 4a and 4b are formed, the semiconductor layer 7 is deposited, for example, from a solution or vapor phase. The semiconductor layer 7 is preferably patterned by dry etching. The semiconductor layer 7 represents the active semiconductor layer of the second TFT 4. The dielectric layer 3 is then deposited on top of the formed structure covering the gate electrode 2c, the source and drain electrodes 4a and 4b and the semiconductor material 7. Preferably, the dielectric layer 3 is deposited from a suitable solution and patterned by dry or wet etching for forming vertical interconnections.

Next, a second suitable conducting layer, for example gold layer, is deposited by means of sputtering or evaporation. This layer forms a second conductive layer. The second conductive layer is then patterned using, for example, lithography followed by wet or dry etching. The resulting patterned conductive layer represents respective components (source and drain) of the first TFT 2 and (gate) of the second TFT 4.

After the source and drain electrodes 2a and 2b and the gate electrodes 4c are formed, the semiconductor material 5 is deposited, for example, from a solution or vapor phase. The semiconductor material 5 is preferably patterned by dry etching. The semiconductor layer represents the active semiconductor layer of the first TFT 2. Preferably, the dielectric and semiconductors are chosen to yield interfaces with desirable chemical and physical properties, notably an interface free of oxygenated groups and/or having a suitable surface energy. The semiconductor materials 5, 7 are, for example, of the same (both p-type or both n-type or both ambipolar-type) or of different type (p-type, n-type, ambipolar-type). For implementations with a single semiconductor type (p-type or n-type or ambipolar-type) of the same or different material, differences in TFT characteristics (e.g., threshold voltage, on-current, off-current) of the top- and bottom-gate TFTs can be used for optimizing the design of logic circuits. Advantages are, for example, increased switching speeds or lower power consumption. To improve the electrical and structural compatibility between source-drain contacts and the semiconductors, the material or surface treatment of the two electrically-conducting layers 2a, 2b, 4a, and 4b can be optimized as couple 2a and 2b or as couple 4a and 4b. For example, a self-assembling thiol-anchored monolayer or a thin spin-coated polymer (e.g. 3 nm polystyrene) is applied to the electrically conducting layer after patterning.

It is noted that in some device layouts the source (2a) or drain (2b) regions of the first TFT 2 are directly connected to the gate region (4c) of the second TFT 4 using the patterning process of 2a, 2b and 4c. Similarly, the source (4a) or drain (4b) regions of the second TFT 4 are, for example, directly connected to the gate region (2c) of the first TFT 2 using the patterning process of 2c, 4a and 4b.

Figure 2:
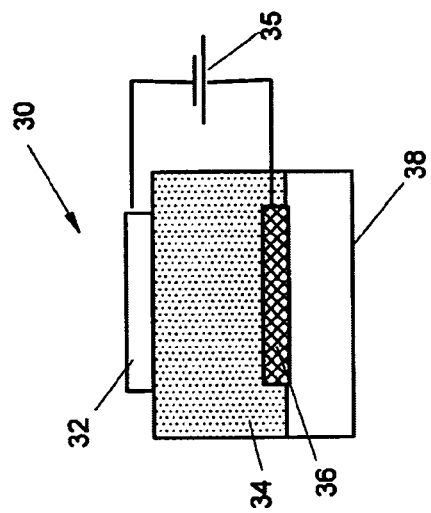
FIGS. 2a and 2b present schematic views of an electronic device according to the invention.
Figure 2:
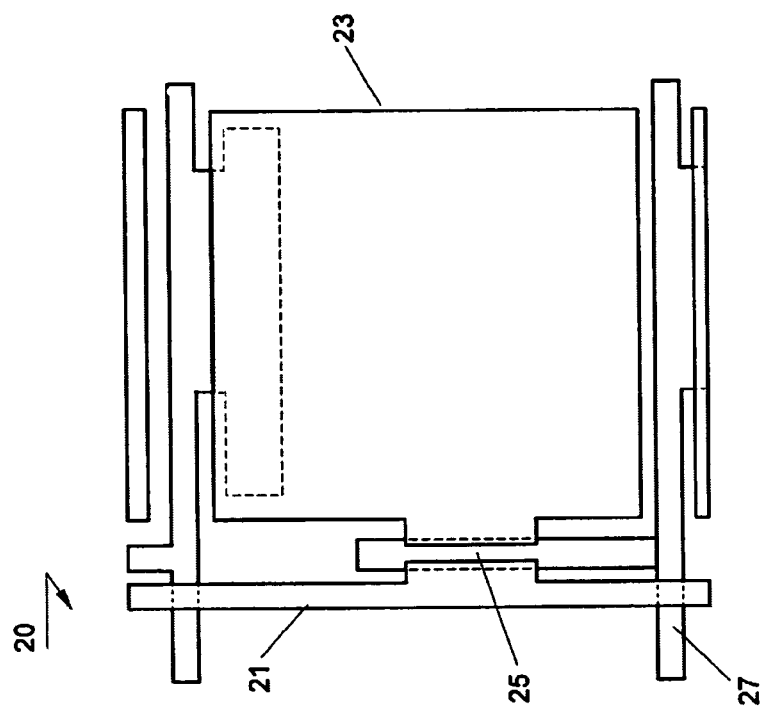

FIGS. 2a and 2b present schematic views of an electronic device according to the invention. The electronic device 20 forms, for example, part of a display, notably a flexible display. Alternatively or additionally the electronic device 20 may form part of a logic circuit, for example radiofrequency identification device (RFID) or display driving circuitry. Flexible displays are potentially used in a variety of portable electronic devices including mobile phones, organizers, etc. The electronic device 20 comprises an active matrix comprising the double TFT arrangement discussed with reference to FIG. 1. Such arrangement, by way of example, forms part of a display's TFT's or of a crossing between different conducting layers in the logic circuit of the display. The active matrix is preferably arranged to collect data from a suitable matrix of data elements, like pixels. For this purpose a column data line 21 is provided that cooperates with the pixel electrode 23 which communicates with the data line 21 via a suitable TFT 25. The row data is collected by the gate line 27 of the TFT 25. It is noted that the electronic device 20 comprises a plurality of TFT's which are arranged with a common gate dielectric layer as discussed with reference to FIG. 1. The equivalent electric circuit 30 of a single TFT shows a suitable source 35 connected to the column electrode 32 and a row electrode 36. The column electrode is separated by the row electrode by a dielectric layer 34. It will be appreciated that a suitable plurality of such TFT's are used, for example, in driving circuitry for a display, notably a flexible display or an RFID. It is also possible to use a sequence of TFT's, discussed with reference to FIG. 1, to form a part or a whole electronic display, notably a flexible electronic display.

Another embodiment comprises a combination of TFT's with an inorganic and an organic semiconductor. For example, using low-temperature poly-silicon (LTPS) based top-gate TFT in which the LTPS semiconductor is the first layer in the stack. Manufacturing this embodiment is accomplished, for example, by performing a method comprising the following steps:

forming a first silicon-based semiconductor layer;

doping and transferring the first silicon layer into a low-temperature poly-silicon layer via a re-crystallization step for forming a semiconductor of the first TFT, forming a first electrically conductive layer for forming an electrode of the first TFT and an electrode of the second TFT;

depositing a dielectric layer;

depositing a second conductive layer for forming a further electrode on the first TFT and a further electrode of the second TFT; and depositing a second semiconductor layer for forming a semiconductor of the second TFT.

It is noted that for the second semiconductor an organic or an inorganic material may be selected. Such materials are known in the art. In a further embodiment for the first and/or the second semiconductor layer an amorphous silicon-based, or a Zinc Oxide or another inorganic semiconductor material may be selected.

While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below.

The invention claimed is:

1. An electronic device comprising a sequence of a first thin film transistor (TFT) and a second TFT, the first TFT comprising a first set of electrodes separated by a first insulator, the second TFT comprising a second set of electrodes separated by a second insulator, wherein a first part of the first set of electrodes and a first part of the second set of electrodes are formed from a first shared conductive layer, a second part of the first set of electrodes and a second part of the second set of electrodes are formed from a second shared conductive layer, the first insulator and the second insulator being formed by a shared dielectric layer, wherein like components of the second TFT are spatially inverted with respect to like components of the first TFT, wherein the first part of the first set of electrodes and the first part of the second set of electrodes are disposed above the shared dielectric layer, and the second part of the first set of electrodes and the second part of the second set of electrodes are disposed below the shared dielectric layer.

2. The electronic device according to claim 1, wherein the like components comprise a gate, a drain and/or a source.

3. The electronic device according to claim 2, wherein the first TFT comprises bottom-gate architecture and the second TFT comprises top-gate architecture.

4. The electronic device according to claim 1, wherein at least one of a semiconductor layer of the first TFT and/or a semiconductor layer of the second TFT are selectable from the group comprising an organic material and an inorganic material.

5. The electronic device according to claim 1, wherein the shared dielectric layer comprises a layer of a first material and a layer of a second material.

6. The electronic device according to claim 5, wherein the first material has a dielectric constant in a range of 3.0-4.0, and the second material has a dielectric constant in a range of 1.9-4.0.

7. The electronic device according to claim 5, wherein the first material has a water contact angle in a range of 60-100 degrees, and the second material has a water contact angle in a range of 0-10 degrees.

8. The electronic device according to claim 1, wherein the dielectric layer comprises a mixture of materials.

9. The electronic device according to claim 8, wherein materials constituting the mixture are homogeneously distributed along the dielectric layer.

10. The electronic device according to claim 8, wherein materials constituting the mixture are phase-separated.

11. The electronic device according to claim 1, further comprising a flexible substrate.

12. The electronic device according to claim 1, wherein a semiconductor layer of at least one of the first TFT and/or the second TFT comprises a silicon-based semiconductor material.

13. The electronic device of claim 11, wherein the flexible substrate is a foil.

14. The electronic device of claim 12, wherein the silicon-based semiconductor material is a low-temperature poly-silicon.

* * * * *